(12) United States Patent
Zilkie et al.

(10) Patent No.: US 11,177,627 B2
(45) Date of Patent: Nov. 16, 2021

(54) TUNABLE LASER

(71) Applicants: Rockley Photonics Limited, London (GB); University of Southampton, Southampton (GB)

(72) Inventors: Aaron Zilkie, Pasadena, CA (US); David John Thomson, Southampton (GB); Frederic Yannick Gardes, Southampton (GB)

(73) Assignees: Rockley Photonics Limited, Oxford (GB); University of Southampton, Southampton (GB)

( * ) Notice: Subject to any disclaimer, the term of this patent is extended or adjusted under 35 U.S.C. 154(b) by 15 days.

(21) Appl. No.: 15/999,104

(22) PCT Filed: Feb. 17, 2017

(86) PCT No.: PCT/EP2017/053625
§ 371 (c)(1),
(2) Date: Aug. 17, 2018

(87) PCT Pub. No.: WO2017/140848
PCT Pub. Date: Aug. 24, 2017

(65) Prior Publication Data
US 2019/0341740 A1    Nov. 7, 2019

(30) Foreign Application Priority Data
Feb. 19, 2016   (GB) ..................... 1602950

(51) Int. Cl.
*H01S 5/026* (2006.01)
*H01S 5/0625* (2006.01)
(Continued)

(52) U.S. Cl.
CPC ........ *H01S 5/0261* (2013.01); *H01S 5/06256* (2013.01); *H01S 5/1007* (2013.01);
(Continued)

(58) Field of Classification Search
CPC ...... H01S 5/1007; H01S 5/142; H01S 5/0261; H01S 5/40; H01S 5/0625; H01S 5/10; H01S 5/125; H01S 5/14
(Continued)

(56) References Cited

U.S. PATENT DOCUMENTS 4,896,325 A   1/1990  Coldren
5,379,354 A   1/1995  Jenkins
(Continued)

FOREIGN PATENT DOCUMENTS

EP   0 310 058 A2   4/1989
EP   1 033 841 A2   9/2000
(Continued)

OTHER PUBLICATIONS

U.S. Appl. No. 16/077,437, filed Aug. 10, 2018.
(Continued)

*Primary Examiner* — Tuan N Nguyen
(74) *Attorney, Agent, or Firm* — Lewis Roca Rothgerber Christie LLP

(57) ABSTRACT

A discrete wavelength tunable laser capable of switching between a plurality of lasing channels of different wavelengths, the tunable laser comprising: a semiconductor optical amplifier (SOA); a wavelength demultiplexer (Demux), having a Demux input which receives the output from the SOA, and a plurality of Demux outputs, each Demux output defining a different spatial path for a respective lasing channel; each of the respective lasing channels being within the bandwidth of the SOA; a reflector located within each spatial path for reflecting light of the respective lasing channel; and a lasing suppression mechanism located within each lasing channel; wherein one or more desired lasing channels are selected by application of the lasing suppression mechanism in each spatial path other than the one or
(Continued)

more spatial paths corresponding to the one or more desired lasing channels.

20 Claims, 9 Drawing Sheets

(51) Int. Cl.
  *H01S 5/10* (2021.01)
  *H01S 5/125* (2006.01)
  *H01S 5/14* (2006.01)
  *H01S 5/40* (2006.01)
(52) U.S. Cl.
  CPC .............. *H01S 5/125* (2013.01); *H01S 5/142* (2013.01); *H01S 5/4087* (2013.01)
(58) Field of Classification Search
  USPC .................................. 385/46, 28; 372/50.11
  See application file for complete search history.

(56) References Cited

U.S. PATENT DOCUMENTS

| | | | |
|---|---|---|---|
| 5,396,570 A | 3/1995 | Jenkins et al. | |
| 5,701,371 A * | 12/1997 | Ishida ................ | G02B 6/12019 385/16 |
| 5,757,986 A | 5/1998 | Crampton et al. | |
| 5,987,050 A | 11/1999 | Doerr et al. | |
| 6,014,480 A | 1/2000 | Baney | |
| 6,101,210 A | 8/2000 | Bestwick et al. | |
| 6,108,478 A | 8/2000 | Harpin et al. | |
| 6,298,177 B1 | 10/2001 | House | |
| 6,434,175 B1 | 8/2002 | Zah | |
| 6,570,893 B1 | 5/2003 | Libatique et al. | |
| 6,571,038 B1 | 5/2003 | Joyner et al. | |
| 6,728,279 B1 | 4/2004 | Sarlet et al. | |
| 6,768,827 B2 | 7/2004 | Yoo | |
| 6,801,702 B2 | 10/2004 | Day | |
| 6,873,763 B2 | 3/2005 | Nikonov | |
| 6,901,178 B2 * | 5/2005 | Bernasconi ........ | G02B 6/12019 385/140 |
| 6,950,450 B2 | 9/2005 | Simsarian et al. | |
| 6,990,257 B2 * | 1/2006 | Gunn, III ............... | B82Y 20/00 385/129 |
| 7,072,542 B2 | 7/2006 | Jenkins et al. | |
| 7,145,923 B2 | 12/2006 | Carter et al. | |
| 7,505,686 B2 * | 3/2009 | Jennen .................. | H04J 14/021 398/45 |
| 7,885,492 B2 | 2/2011 | Welch et al. | |
| 8,295,315 B2 | 10/2012 | Ward et al. | |
| 8,346,028 B2 | 1/2013 | Feng et al. | |
| 8,368,995 B2 | 2/2013 | Dallesasse et al. | |
| 8,548,334 B2 | 10/2013 | Mazed | |
| 8,559,470 B2 | 10/2013 | Dallesasse et al. | |
| 8,724,988 B2 | 5/2014 | Andriolli et al. | |
| 8,818,208 B2 | 8/2014 | Zheng et al. | |
| 8,837,548 B2 * | 9/2014 | Tanaka .................. | H01S 5/1032 372/50.11 |
| 9,270,078 B2 | 2/2016 | Rickman et al. | |
| 9,627,851 B1 | 4/2017 | Zilkie | |
| 9,660,411 B2 | 5/2017 | Rickman et al. | |
| 10,594,109 B2 * | 3/2020 | Zilkie .................. | H01S 5/0268 |
| 2003/0063885 A1 * | 4/2003 | Gunn, III .............. | G02F 1/3133 385/131 |
| 2003/0067678 A1 | 4/2003 | Shibata et al. | |
| 2003/0086465 A1 | 5/2003 | Peters et al. | |
| 2003/0123784 A1 | 7/2003 | Mukai | |
| 2004/0017604 A1 | 1/2004 | DiJaili et al. | |
| 2004/0033004 A1 * | 2/2004 | Welch .................... | B82Y 20/00 385/14 |
| 2004/0190562 A1 | 9/2004 | Nakano et al. | |
| 2004/0228564 A1 * | 11/2004 | Gunn, III ........... | G02B 6/12007 385/1 |
| 2005/0036739 A1 * | 2/2005 | Doerr ................. | G02B 6/12019 385/46 |
| 2005/0078359 A1 | 4/2005 | Kim et al. | |
| 2005/0244994 A1 | 11/2005 | Meliga et al. | |
| 2008/0166134 A1 | 7/2008 | McCallion et al. | |
| 2009/0324173 A1 | 12/2009 | Asghari | |
| 2010/0189143 A1 | 7/2010 | Fukuda | |
| 2010/0246612 A1 | 9/2010 | Shimizu | |
| 2011/0149381 A1 | 6/2011 | Hatakeyama | |
| 2011/0206313 A1 | 8/2011 | Dong et al. | |
| 2011/0235659 A1 | 9/2011 | Fukuda | |
| 2011/0293279 A1 | 12/2011 | Lam et al. | |
| 2012/0057610 A1 | 3/2012 | Dallesasse et al. | |
| 2012/0062900 A1 | 3/2012 | Langley et al. | |
| 2013/0016423 A1 | 1/2013 | Zheng et al. | |
| 2013/0051798 A1 | 2/2013 | Chen et al. | |
| 2013/0223844 A1 | 8/2013 | Hwang | |
| 2013/0235890 A1 | 9/2013 | Creazzo et al. | |
| 2014/0133511 A1 * | 5/2014 | Tanaka .................. | H01S 5/1032 372/50.11 |
| 2015/0023382 A1 * | 1/2015 | Schell ..................... | H01S 5/141 372/96 |
| 2015/0207296 A1 | 7/2015 | Rickman et al. | |
| 2020/0220326 A1 | 7/2020 | Zilkie | |
| 2020/0295537 A1 * | 9/2020 | Zilkie ..................... | H01S 5/125 |

FOREIGN PATENT DOCUMENTS

| | | |
|---|---|---|
| EP | 1 300 918 A2 | 4/2003 |
| EP | 1 761 103 A1 | 3/2007 |
| EP | 2 544 319 A1 | 1/2013 |
| GB | 2 386 778 A | 9/2003 |
| GB | 2563364 A | 12/2018 |
| GB | 2563366 A | 12/2018 |
| JP | 2000-332693 A | 11/2000 |
| JP | 2013-93627 A1 | 5/2013 |
| WO | WO 00/36715 A1 | 6/2000 |
| WO | WO 01/17073 A1 | 3/2001 |
| WO | WO 02/41663 A2 | 5/2002 |
| WO | WO 02/079863 A2 | 10/2002 |
| WO | WO 2010/100489 A1 | 9/2010 |
| WO | WO 2014/060648 A1 | 4/2014 |
| WO | WO 2016/045087 A1 | 3/2016 |
| WO | WO 2017/140848 A1 | 8/2017 |
| WO | WO 2017/141040 A1 | 8/2017 |

OTHER PUBLICATIONS

U.S. Office Action dated Jan. 28, 2019, for U.S. Appl. No. 16/077,437, 13 pages.
U.S. Office Action dated Jul. 15, 2019, for U.S. Appl. No. 16/077,437, 14 pages.
Babaud, et al., "First Integrated Continuously Tunable AWG-Based Laser Using Electro-Optical Phase Shifters," Proceedings of the 12th European conference on Integrated Optics (ECIO '05) Apr. 6-8, 2005, Grenoble, France, pp. 156-159.
Feng, Dazeng et al., "Compact single-chip VMUX/DEMUX on the silicon-on-insulator platform", Optics Express, Mar. 28, 2011, pp. 6125-6130, vol. 19, No. 7, Optical Society of America.
International Search Report and Written Opinion of the International Searching Authority, dated May 19, 2017, Corresponding to PCT/EP2017/053625, 16 pages.
International Search Report and Written Opinion, corresponding to PCT/GB2017/050408, dated May 23, 2017, 15 pages.
Keyvaninia, S. et al., "III-V-on-silicon multi-frequency lasers", Optics Express, Jun. 3, 2013, pp. 13675-13683, vol. 21, No. 11, Optical Society of America.
Lawniczuk, et al., "AWG-Based Photonic Transmitter With DBR Mirrors and Mach-Zehnder Modulators," IEEE Photonics Technology Letters, vol. 26, No. 7, Apr. 1, 2014, pp. 710-713.
Munoz, et al., "Multi-wavelength laser based on an Arrayed Waveguide Grating and Sagnac loop reflectors monolithically integrated on InP," Proceedings of the 15th European Conference on Integrated Optics, ECIO 2010, Apr. 6-9, 2010, Cambridge, United Kingdom, pp. 2.
Reid, et al., "A novel broadband DBR laser for DWDM networks with simplified quasi-digital wavelength selection," Thursday Afternoon / OFC 2002 / pp. 541-543.

(56) References Cited

OTHER PUBLICATIONS

Sanjoh, et al., "Multiwavelength Light Source with Precise Frequency Spacing Using a Mode-Locked Semiconductor Laser and an Arrayed Waveguide Grating Filter," IEEE Photonics Technology Letters, vol. 9, No. 6, Jun. 1997, pp. 818-820.
Simsarian, et al., "Fast Switching Characteristics of a Widely Tunable Laser Transmitter," IEEE Photonics Technology Letters, vol. 15, No. 8, Aug. 2003, pp. 1038-1040.
Simsarian, et al., "Less Than 5-ns Wavelength Switching With an SG-DBR Laser," IEEE Photonics Technology Letters, vol. 18, No. 4, Feb. 15, 2006, pp. 565-567.
Su, et al., "Improving the Switching Performance of a Wavelength-Tunable Laser Transmitter Using a Simple and Effective Driver Circuit," IEEE Photonics Technology Letters, vol. 16, No. 9, Sep. 2004, pp. 2132-2134.
U.K. Intellectual Property Office Search Report, dated Aug. 30, 2016, for Patent Application No. GB1602947.2, 3 pages.
U.K. Intellectual Property Office Search Report, dated Sep. 2, 2016, for Patent Application No. GB 1602950.6, 5 pages.
"UltraVOA SFP Module", Silicon Photonics Product Brief, 2014, pp. 1-2, Mellanox Technologies.
Ward, et al., "Widely Tunable DS-DBR Laser With Monolithically Integrated SOA: Design and Performance," IEEE Journal of Selected Topics in Quantum Electronics, vol. 11, No. 1, Jan./Feb. 2005, pp. 149-156.
Whitbread, et al, "Digital wavelength selected DBR laser," Novel In-Plane Semiconductor Lasers II, Proceedings of SPIE vol. 4995, pp. 81-93.
Zheng, D. W. et al., "Improved efficiency Si-photonic attenuator", Optics Express, Oct. 13, 2008, pp. 16754-16765, vol. 16, No. 21, Optical Society of America.
Bernasconi, P. et al., Optical Switch Fabrics for Ultra-High-Capacity IP Routers, Journal of Lightwave Technology, Nov. 2003, pp. 2839-2850, vol. 21, No. 11, IEEE.
Cherchi, M. et al., Deeply etched MMI-based components on 4 μm thick SOI for SOA-based optical RAM cell circuits, Proceedings of SPIE, Jan. 1, 2013, 7 Pages, vol. 8629, No. 86290C-1, International Society for Optical Engineering, United States.
Farrington, N. et al., A Demonstration of Ultra-Low-Latency Data Center Optical Circuit Switching, ACM SIGCOMM Computer Communication Review '12, Aug. 13-17, 2012, pp. 95-96, vol. 42, No. 4.
Fischer, A.P.A. et al., Experimental and Theoretical Study of Filtered Optical Feedback in a Semiconductor Laser, IEEE Journal of Quantum Electronics, Mar. 2000, pp. 375-384, vol. 36, No. 3, IEEE.
Fujioka, N. et al., Compact and Low Power Consumption Hybrid Integrated Wavelength Tunable Laser Module Using Silicon Waveguide Resonators, Journal of Lightwave Technology, Nov. 1, 2010, pp. 3115-3120, vol. 28, No. 21.
Huang, Z. et al., Four-Wavelength III-V/SOI Heterogeneous Integrated Laser Based on Sampled Bragg Grating for CWDM, IEEE Photonics Journal, Oct. 2013, 7 Pages, vol. 5, No. 5, IEEE Photonics Society Publication.
International Search Report and Written Opinion of the International Searching Authority, dated Jul. 14, 2015, Corresponding to PCT/GB2015/050105, 19 pages.
International Search Report and Written Opinion of the International Searching Authority, dated Sep. 16, 2015, Corresponding to PCT/GB2015/050524, 18 Pages.
Jalali, B. et al., Silicon Photonics, Journal of Lightwave Technology, Dec. 2006, pp. 4600-4615, vol. 24, No. 12.
Kachris, C. et al., A Survey on Optical Interconnects for Data Centers, IEEE Communications Surveys & Tutorials, Fourth Quarter 2012, pp. 1021-1036, vol. 14, No. 4.
Ngo, H.Q. et al., Constructions and Analyses of Nonblocking WDM Switches Based on Arrayed Waveguide Grating and Limited Wavelength Conversion, IEEE/ACM Transactions on Networking, Feb. 2006, pp. 205-217, vol. 14, No. 1.

Partial International Search for Patent Application No. PCT/GB2015/050105, dated May 4, 2015, 6 Pages.
Proietti, R. et al., 40 Gb/s 8×8 Low-latency Optical Switch for Data Centers, OSA/OFC/NFOEC, 2011, 3 Pages.
Proietti, R. et al., TONAK: A Distributed Low-latency and Scalable Optical Switch Architecture, 39th European Conference and Exhibition on Optical Communication (ECOC), 2013, pp. 1005-1007.
Smith, B.T. et al., Fundamentals of Silicon Photonic Devices, 2006, 7 Pages.
Tanaka, S. et al., High-output-power, single-wavelength silicon hybrid laser using precise flip-chip bonding technology, Optics Express, Dec. 4, 2012, pp. 28057-28069, vol. 20, No. 27.
Tsao, S. et al., A Novel MMI-MI SOI Temperature Sensor, IEEE 13th Annual Meeting Lasers and Electro-Optics Society 2000 Annual Meeting, LEOS 2000, 2000, pp. 464-465, vol. 2.
U.K. Intellectual Property Office Search Report dated Jul. 31, 2014, for Patent Application No. GB1400909.6, 5 Pages.
U.K. Intellectual Property Office Search Report, Claims 27-52, dated Oct. 20, 2014, for Patent Application No. GB1400909.6, 3 Pages.
U.K. Intellectual Property Office Search Report, Claims 53-69, dated Oct. 20, 2014, for Patent Application No. GB1400909.6, 2 Pages.
U.K. Intellectual Property Office Search Report, Claims 70-72, dated Oct. 20, 2014, for Patent Application No. GB1400909.6, 3 Pages.
U.K. Intellectual Property Office Search Report, dated Nov. 5, 2015, for Patent Application No. GB1400909.6, 5 Pages.
Website: TL5300 Series LambdaFLEX Micro-iTLA Tunable Laser, Oclaro, Inc., http://www.oclaro.com/product/tl5300-series/, printed Nov. 3, 2015, 3 Pages.
Xi, K. et al., Petabit Optical Switch for Data Center Networks, Technical Report, Sep. 11, 2010, pp. 1-9, Polytechnic Electrical & Computer Engineering Department, Polytechnic Institute of NYU, Brooklyn, New York. Located at http://eeweb.poly.edu/chao/publications/petasw.pdf.
Xu, D.X. et al., SOI Photonic Wire Waveguide Ring Resonators Using MMI Couplers, 3rd IEEE International Conference on Group IV Photonics, 2006, pp. 28-30, IEEE.
Ye, T. et al., A Study of Modular AWGs for Large-Scale Optical Switching Systems, Journal of Lightwave Technology, Jul. 1, 2012, pp. 2125-2133, vol. 30, No. 13.
Ye, T. et al., AWG-Based Non-Blocking Clos Networks, IEEE/ACM Transactions on Networking, Apr. 2015, pp. 491-504, vol. 23, No. 2.
Zhao, J. et al., Novel Lasers Using Multimode Interference Reflector, 2011 ICO International Conference on Information Photonics (IP), May 18, 2011, pp. 1-2; IEEE.
Zhao, J. et al., On-chip Laser with Multimode Interference Reflectors Realized in a Generic Integration Platform, Compound Semiconductor Week (CSW/IPRM), 23rd International Conference on Indium Phosphide and Related Materials, May 22, 2011, pp. 1-4, IEEE.
Zilkie, A.J. et al., Power-efficient III-V/Silicon external cavity DBR lasers, Optics Express, Sep. 27, 2012, pp. 23456-23462, vol. 20, No. 21.
Unpublished U.S. Appl. No. 16/889,656, filed Jun. 1, 2020.
International Preliminary Report on Patentability of the International Searching Authority, dated Aug. 21, 2018, Corresponding to PCT/GB2017/050408, 7 pages.
U.K. Intellectual Property Office Examination Report, dated May 22, 2020, for Patent Application No. GB1815248.8, 2 pages.
U.K. Intellectual Property Office Examination Report, dated Jun. 22, 2020, for Patent Application No. GB1602947.2, 7 pages.
U.K. Intellectual Property Office Examination Report, dated May 26, 2021, for Patent Application No. GB1602947.2, 6 pages.
U.K. Intellectual Property Office Examination Report, dated Dec. 18, 2020, for Patent Application No. GB1602947.2, 9 pages.
U.K. Intellectual Property Office Examination Report, dated Dec. 18, 2020, for Patent Application No. GB1815248.8, 8 pages.

(56) References Cited

OTHER PUBLICATIONS

U.K. Intellectual Property Office Examination Report, dated Mar. 18, 2021, for patent application No. GB1602947.2, 4 pages.

\* cited by examiner

TUNABLE LASER

CROSS-REFERENCE TO RELATED APPLICATION(S)

This application is a National Phase Patent Application and claims priority to and the benefit of International Application Number PCT/EP2017/053625, filed on Feb. 17, 2017, which claims priority to British Patent Application Number 1602950.6, filed on Feb. 19, 2016; the entire contents of both of the documents identified in this paragraph are incorporated herein by reference.

FIELD OF THE INVENTION

The present invention relates to a discrete wavelength tunable laser, particularly to a discrete wavelength tunable laser having an optical cavity which includes a combination of a wavelength demultiplexer for splitting light into a plurality of possible lasing channels; each possible lasing channel comprising a lasing suppression mechanism.

BACKGROUND OF THE INVENTION

Continuously tunable lasers are well-established and are commonplace in telecommunications applications. Although telecommunications lasers operate to fixed grids (e.g. ITU grids), tunable lasers need to be set up for a variety of applications and some extent of wavelength tunability is desirable to allow for correction of wavelength drift as the laser ages. Unfortunately, the requirement for full range continuous tunability results in expensive and power-hungry electronic circuitry, most particularly due to the requirement for digital-analog conversion (DAC) chips.

Distributed Feedback (DFB) lasers in which the gratings are built into the gain medium are being replaced by Distributed Bragg Reflector (DBR) lasers, particularly where tunability is required. For a wide range of tunability a Sampled Grating (SG) DBR laser is one typical option. In such a laser, the grating (often referred to as a "comb grating") gives rise to a comb of reflectivity peaks which can be tuned to select the required lasing wavelength.

In an alternative design of tunable laser, Digital Supermode DBRs (DS-DBRs) may be utilised. The DS-DBR design has the advantage over SG-DBR in that no DACs are required. However, tunable lasers made entirely on semiconductor chips have been impossible without gratings requiring DACs for control. For example, no tunable laser has been made with solely DS-DBR gratings (i.e. with no other types of gratings present). The challenge of this patent application is to create tunable lasers based upon the DS-DBR design principle but with cheaper and lower power consuming control electronics, in particular not requiring DACs. Semiconductor lasers, made absent DACs for primary control, are disclosed herein. This is achieved principally by devising finite state tunable devices.

The application of the AWG as a wavelength selective device for laser arrays is known (Keyvaninia et al, Optics Express, 21 (No11) p13675, 30 May 2013).

SUMMARY OF THE INVENTION

Accordingly, the present invention aims to solve the above problems by providing, according to a first aspect, a discrete wavelength tunable laser capable of switching between a plurality of lasing channels of different wavelengths, the tunable laser comprising:

a semiconductor optical amplifier (SOA);
a wavelength demultiplexer (Demux), having a Demux input which receives the output from the SOA, and a plurality of Demux outputs, each Demux output defining a different spatial path for a respective lasing channel; each of the respective lasing channels being within the bandwidth of the SOA;
a reflector located within each spatial path for reflecting light of the respective lasing channel; and
a lasing suppression mechanism located within each lasing channel;
wherein one or more desired lasing channels are selected by application of the lasing suppression mechanism in each spatial path other than the one or more spatial paths corresponding to the one or more desired lasing channels.

A single SOA can therefore provide the light for all channels of the tunable laser. That is to say, it is possible for no more than one SOA to be present. This means that the wavelength tunable laser of the present invention achieves wavelength switching without the need for multiple (separate) SOAs. This is particularly advantageous for providing a low complexity discrete wavelength tunable laser capable of switching between a plurality of discrete possible lasing channels.

Optional features of the invention will now be set out. These are applicable singly or in any combination with any aspect of the invention.

In some embodiments, no more than one lasing channel may be selected at any one time. In such embodiments, a single desired lasing channel is selected by application of the lasing suppression mechanism in each spatial path other than the spatial path corresponding to the desired lasing channel.

In some embodiments, the lasing suppression mechanism is an optical amplitude modulator.

This optical amplitude modulator may take the form of a variable optical attenuator.

In some embodiments, the variable optical attenuator (VOA) works by carrier injection. It comprises a carrier injection region, for example a pn or pin junction positioned across the waveguide. Application of a bias to the junction causes a change in the free carrier concentration along the optical path of the light, which in turn affects the amount of light attenuated. Examples of such VOAs can be found in "Improved efficiency Si-photonic attenuator" Optics Express, 13 Oct. 2008, Vol. 16, No. 21, 16754 and also in "Compact single-chip VMUX/DEMUX on the silicon-on-insulator platform", Optics Express, 28 Mar. 2011, Vol. 19, No. 7, 6125.

In some embodiments, the carrier injection region comprises a pn junction.

In other embodiments, the carrier injection region comprises a pin junction.

The lasing suppression mechanism of each lasing channel may be separate from the corresponding reflector for reflecting that specific lasing channel. The lasing suppression mechanism for each lasing channel may be located in-between the respective output of the Demux (i.e. the output for that lasing channel) and the reflector of that lasing channel.

In this way, since there is no need to switch between different SOAs, there is no requirement for complicated driving circuits to switch SOAs on and off. Instead, the entire tunable laser can be operated by a simple driving circuit which drives the absorption modulators, the absorption modulators behaving as optical shutters.

The waveguides of the discrete wavelength tunable laser may be arranged so that an array of parallel waveguides form the spatial paths of the lasing channels. Since each lasing channel includes a lasing suppression mechanism, the lasing suppression mechanisms may be arranged in an array such as that shown in Optics Express, 28 Mar. 2011, Vol. 19, No. 7, 6125.

In some embodiments, the lasing suppression mechanism for each lasing channel is provided by the reflector of that lasing channel by tuning the reflection spectrum of the reflector away from the Demux output of the respective spectral path. In this way, the lasing suppression mechanism provided for each lasing channel is the effect of tuning the reflector's reflection spectrum out of the Demux transmission passband on its corresponding spatial path.

In any of the embodiments described herein, the reflector could be any selective reflector, one example of which is a distributed Bragg reflector DBR tuned to reflect light with a wavelength corresponding to that of the lasing channel of the spatial path in which it is located.

Where the lasing suppression mechanism for the lasing channel is a separate attenuator, a fixed wavelength DBR could be used. However, where the reflector itself forms the lasing suppression mechanism, the DBR will take the form of a tunable DBR.

Again, because there is no need to switch between different SOAs, there is no requirement for complicated driving circuits to switch SOAs on and off. Instead, the entire tunable laser can be operated by a simple driving circuit which drives the one or more DS-tunable DBRs directly.

Typical injected electron and hole densities, which give rise to the tuning properties of the DBR would be in the range $1\times10^{17}$ to $1\times10^{19}$ per $cm^3$.

In some embodiments, the SOA (Semiconductor Optical Amplifier) is an RSOA (Reflective Semiconductor Optical Amplifier).

In any of the embodiments described herein, said mirror located at the back end of the semiconductor gain medium may preferably have a reflectivity of at least 85% and even more preferably, the mirror has a reflectivity of at least 90%. A standard high reflectivity coating may be applied to give the desired reflectivity over the desired bandwidth.

In some embodiments, the Demux is a passive optical component, the optical path through which (i.e. which output light exits the Demux from) depends upon the wavelength of the light at its input. Examples of a Demux include: an Arrayed Waveguide Grating (AWG); a Planar Concave Grating (PCG) also known as an echelle grating, a ring resonator array, an interleaver structure, and a multimode interference (MMI) device. A cascaded Mach Zender interferometers could also be used as a Demux.

The MMI device may be an angled MMI device, examples of which are found in: Y. Hu, R. M. Jenkins, F. Y. Gardes, E. D. Finlayson, G. Z. Mashanovich, and G. T. Reed, "Wavelength division (de)multiplexing based on waveguide mode dispersion," Optics Letters, vol. 36, pp. 4488-4490, 2011; and Y. Hu, F. Y. Gardes, D. J. Thomson, G. Z. Mashanovich, and G. T. Reed, "Coarse wavelength division (de)multiplexer using interleaved angled multimode interferometer structure," Applied Physics Letters, vol. 102, 251116, 2013.

The tunable laser may also comprise a multiplexer (Mux) to multiplex light from each of the lasing channels into a single output of the cavity. In this way, the output mirror of the cavity may be conveniently located at the opposite end of the cavity to the SOA which is particularly beneficial where the SOA is an RSOA.

The optical cavity of the tunable laser is therefore formed between a back end mirror on the RSOA and a front end mirror formed by the one of the DBRs which has been selected by application of voltages to the shutters.

Again, the Mux may take the form of a passive optical component such as: an Arrayed Waveguide Grating (AWG); a Planar Concave Grating (PCG); a ring resonator array, an interleaver structure, or a multimode interference device (MMI). Again, a cascaded Mach Zehnder interferometer could be used to form the Mux.

In some embodiments, the Demux is a flat-top Demux. In this way, tunablilty within each lasing channel would be provided. In such a way, it is envisaged that the laser could be tuned over a continuous range of wavelengths rather than forming a tunable laser.

An example of a flat top device (50 GHz 1 dB BW, within a 100 GHz channel) can be found in Optics Express, 28 Mar. 2011, Vol. 19, No. 7, 6125. A greater flat top bandwidth gives rise to a greater tuning range within each channel.

In some embodiments, where the preventative mechanism is not part of the DBR itself (e.g. but is a separate component such as an optical amplitude modulator or another shutter-like device), the presence of the optical amplitude modulator enables fixed DBRs to be used rather than tunable DBRs. Fixed DBRs are easier and cheaper to produce and have no requirement for de-tuning circuitry to be applied.

Of course, it will be appreciated by one skilled in the art that, whilst it is possible to manufacture DBRs with pre-defined wavelengths, the wavelength of a given DBR may vary within a band of manufacturing tolerance. Thus it may be necessary to a small bias adjustment (phase adjustment) in order to trim the wavelength to that required for the proper operation of the device.

Where tunable DBRs are present, it is also envisaged that the tunable DBRs (which may take the form of DS-DBRs) could be adapted to compensate for the spectral profile of the gain medium. The gain element will have a large spectral range over which the power of light generated will depend upon the wavelength. Usually there will be less power at the two extremes of the spectral range, creating a "drop off" in power at the edges of the range. The DBRs could be adapted to compensate for such drops in gain. For example, the reflectivity of the DBR could be reduced at parts of the DBR which correspond to high-gain regions of the spectral profile of the gain medium. Alternatively, or in addition, the reflectivity of DBRs could be increased at sections configured to reflect wavelengths which correspond to spectral regions of low-gain from the gain medium.

A further alternative mechanism for compensating for such gain drops could be by providing attenuators that are external to the DBR in the central channels that correspond to the high-gain regions. Alternatively, the DEMUX and/or MUX could itself be designed to compensate for the spectral response of the gain medium.

Optionally, for any one of the aspects above, the tunable laser may further comprise one or more phase tuner(s) for fine tuning the wavelength of the laser.

This phase tuner would be separate from any phase tuners that may form part of the tunable DBR(s). The fine tuning phase tuner may be used to account for drift due to temperature or other environmental factors.

According to a further aspect of the present invention, there is provided a discrete wavelength tunable laser capable of switching between a plurality of lasing channels of different wavelengths, the tunable laser comprising: a semiconductor optical amplifier (SOA); a wavelength demultiplexer (Demux), having a Demux input which receives the output from the SOA, and a plurality of Demux outputs, each Demux output defining a different spatial path for a respective lasing channel; each of the respective lasing channels being within the bandwidth of the SOA; a reflector located within each spatial path for reflecting light of the respective lasing channel; and a lasing selection mechanism located within each lasing channel, each lasing suppression mechanism arranged to receive a bias for suppressing or enhancing the lasing of said lasing channel upon application of the bias.

In any of the embodiments described herein, said mirror located at the back end of the semiconductor gain medium may preferably have a reflectivity of at least 85% and even more preferably, the mirror has a reflectivity of at least 90%. A standard high reflectivity coating may be applied to give the desired reflectivity over the desired bandwidth.

Further optional features of the invention are set out below.

BRIEF DESCRIPTION OF THE DRAWINGS

Embodiments of the invention will now be described by way of example with reference to the accompanying drawings in which:

FIG. 1b shows a schematic diagram of spectral profiles of the AWG and DBR gratings of the embodiment shown in FIG. 1a;

DETAILED DESCRIPTION AND FURTHER OPTIONAL FEATURES OF THE INVENTION

Figure 1A:
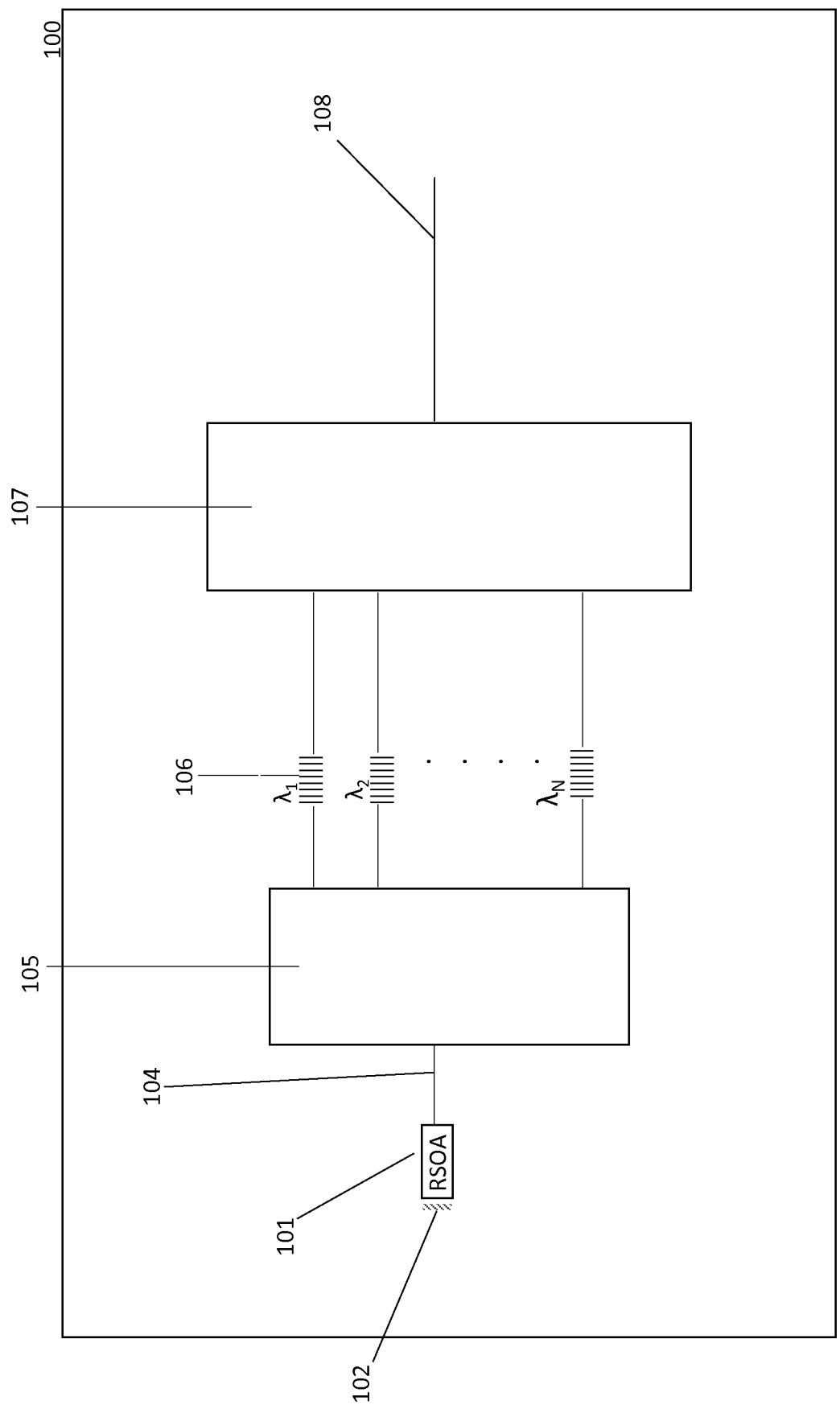
FIG. 1a shows a schematic diagram of a tunable laser.

A first embodiment of a tunable laser 100 is described with reference to FIGS. 1a and 1b. The tunable laser 100 includes a semiconductor optical amplifier (SOA) in the form of a reflective semiconductor optical amplifier (RSOA) 101 which generates light over a given gain bandwidth. The back surface of the RSOA 102 includes a high reflectivity mirror 102 forming back end mirror of the optical cavity of the tunable laser.

The high reflectivity mirror 102 could have a reflectivity of at least 85% and even more preferably of at least 90%. A standard high reflectivity coating may be applied to give the desired reflectivity over the desired bandwidth.

The tunable laser includes a wavelength demultiplexer 105 (Demux), in this case, the Demux takes the form of an Arrayed Waveguide Grating (AWG), particularly a 1×N AWG. The Demux has a single input optically coupled to the output of the RSOA 101 via a waveguide 104.

The Demux has N outputs, each of which transmits (passes) a respective fixed spectral passband, each of which lies within the bandwidth of the SOA. In other words, each output of the Demux corresponds to a possible lasing channel of the tunable laser.

A plurality N of waveguides are each optically coupled to a respective one of the N outputs of the Demux. Each output waveguide therefore corresponds to a particular lasing channel of the laser.

Each of the N output waveguides includes a tunable distributed Bragg reflector (DBR) grating 106 and each DBR is configured to be tuned at or near to the center wavelength of that channel (i.e. to cause a back-reflection within the spectral range of that Demux output) when no bias current is applied to that DBR. Where no bias is applied, the DBR grating therefore becomes the front end mirror of an optical cavity comprising that waveguide, creating an active lasing channel.

When a bias is applied to the DRB grating to detune it (and therefore to un-select that lasing channel), the resulting phase change means that the reflection peak of the grating becomes de-tuned from the center wavelength of the light from the Demux for that channel. The unwanted channels (i.e. all but one of the possible lasing channel of the laser) are therefore de-selected, and the one remaining lasing channel corresponding to the desired wavelength is therefore chosen by default. This chosen channel will be the only lasing channel in which there exists an overlap between the reflection band of a given DBR and the fixed spectral output of the Demux to which it is optically coupled.

Each of tunable DBRs may include a pn or a pin junction and electrical connections including a drive circuit and drive pins which provide an electrical contact between the drive circuit and the pn/pin junction. By applying a bias from the drive circuit, the DBR is configured such that it can be switched to its "on" wavelength by application of a single set voltage. In the "on" state the wavelength reflected by the grating does not overlap with the wavelength of light it receives from the Demux output. In the "off" state the reflection wavelength of the DBR corresponds to the wavelength of light it receives from the respective output of the Demux, so light is reflected. All but one of the gratings 106 will be "on" at a given time in order for an active lasing channel to be selected. When a DBR 106 of a desired lasing channel is chosen (i.e. when it is the only DBR which exists in an "off" configuration where no bias is applied to it), it forms the front end mirror of the optical cavity.

In some embodiments, more than one lasing channel may be selected at once. For example, if two lasing channels are chosen at once, the DBRs of those two lasing channels will both exist in the "off" configurations and will therefore reflect, forming front end mirrors of the optical cavity. All other DBRs will exist in the "on" configuration so will not act as reflectors.

Figure 1B:
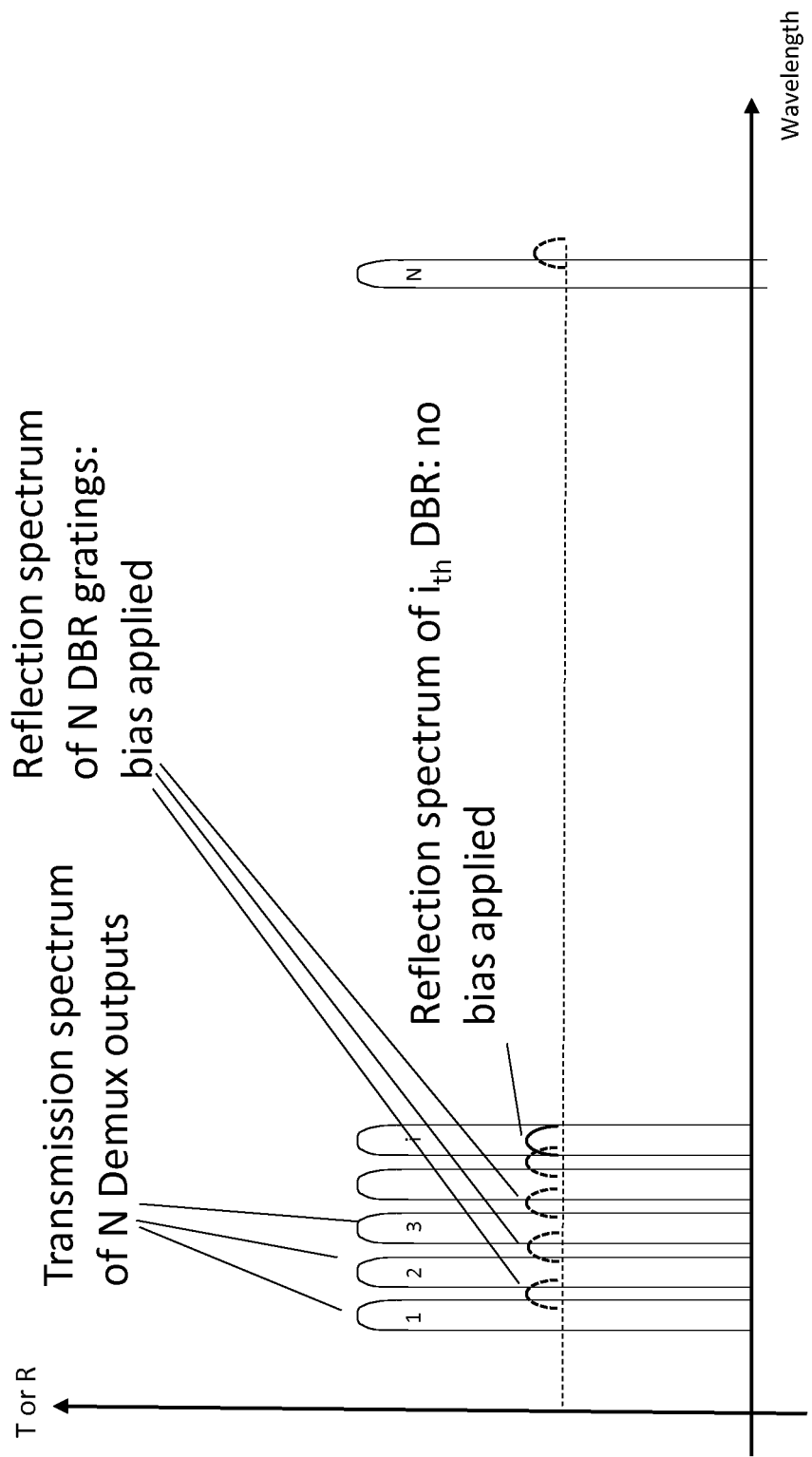

The activation of a required wavelength channel (i.e. the lasing wavelength of the laser) can be seen in more detail in FIG. 1b in which the required channel "i" is activated because the transmission spectrum of the $i^{th}$ one of the N outputs of the Demux is the only one that overlaps spectrally with the reflection spectrum of the chosen one of the N DBR gratings.

The output of the laser light is directed to a single output waveguide by connecting the channelized output waveguides to a multiplexer. In FIG. 1a this multiplexer takes the form of an N×1 AWG 107 although other types of multiplexers may be used. An additional phase tuner (not shown) may be included to provide fine tuning and therefore seeks to provide a mechanism to counter wavelength drift over the lifetime of the tunable laser. In the example shown in FIG.

1, N may be 48, the gratings 106 may have reflectivity of 10%, and the channel spacing of the AWG (Demux) may be 100 GHz. The advantage of this embodiment is that one commercially available RSOA powers all channels, for example all 48 channels. In general the tolerance to aging of this design is also advantageously high.

A second embodiment of a tunable laser 200 is described with reference to FIG. 2. The tunable laser 200 includes a semiconductor optical amplifier (SOA) in the form of a reflective semiconductor optical amplifier (RSOA) 201 which generates light over a given gain bandwidth. The back surface of the RSOA 202 includes a high reflectivity mirror at 202 forming back end mirror of the optical cavity of the tunable laser. As with previous embodiments, this high reflectivity surface may have a reflectivity of at least 85% or, even more preferably, at least 90%.

The tunable laser includes a wavelength demultiplexer 205 (Demux), in this case, the Demux takes the form of an Arrayed Waveguide Grating (AWG), particularly a 1×N AWG. The Demux has a single input optically coupled to the output of the RSOA 101 via a waveguide 104.

The Demux has N outputs, each of which transmits (passes) a respective fixed spectral passband, each of which lies within the bandwidth of the SOA. In other words, each output of the Demux corresponds to a possible lasing channel of the tunable laser.

A plurality N of waveguides are each optically coupled to a respective one of the N outputs of the Demux. Each output waveguide therefore corresponds to a particular lasing channel of the laser.

Each of the N output waveguides includes a fixed distributed Bragg reflector (DBR) grating 106 and each DBR is tuned at or near to the center wavelength of that channel (i.e. to cause a back-reflection within the spectral range of that Demux output) when no bias current is applied to that DBR. Where no bias is applied, the DBR grating therefore becomes the front end mirror of an optical cavity comprising that waveguide, creating an active lasing channel.

Figure 2:
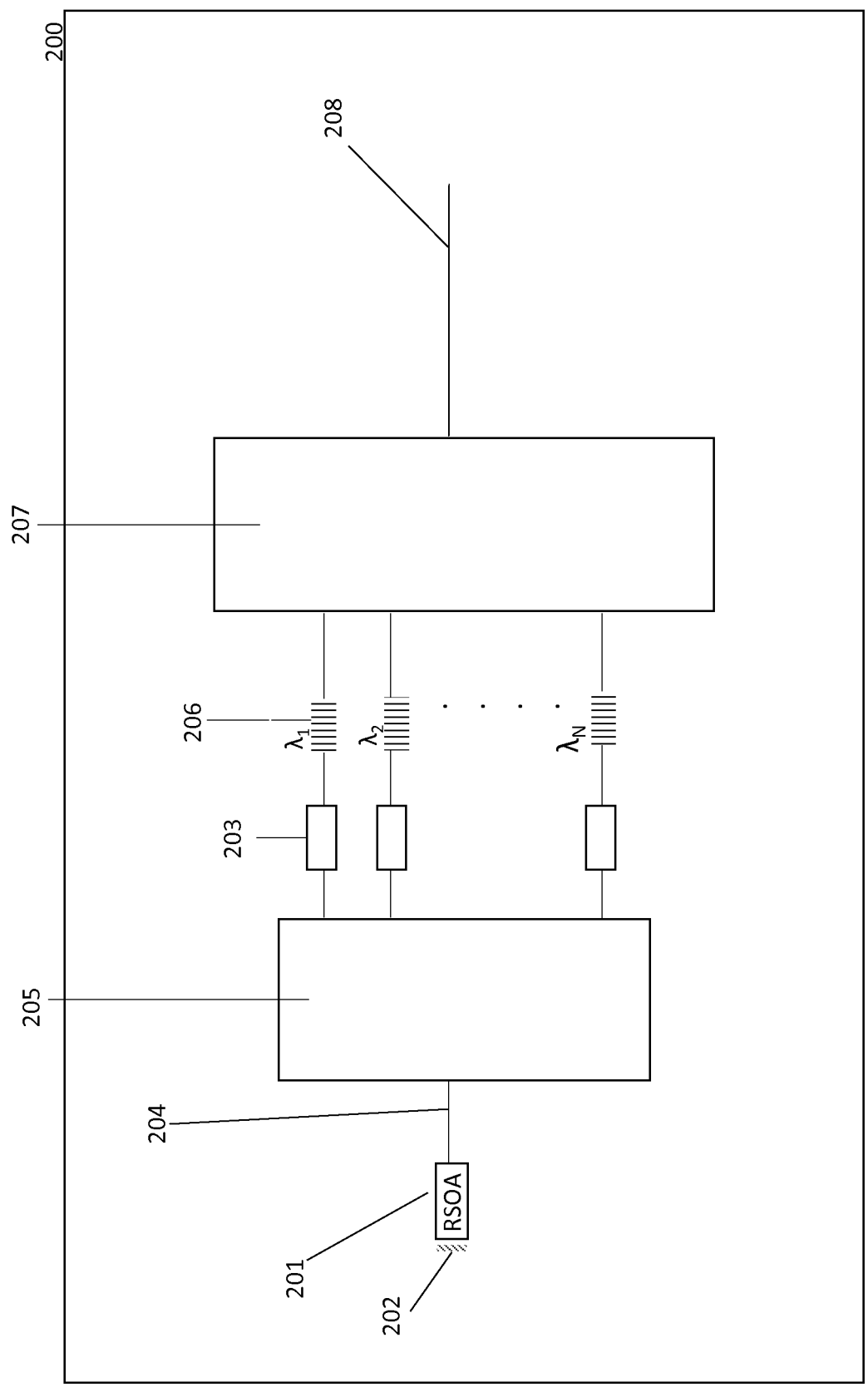
FIG. 2 shows a schematic diagram of an alternative tunable laser.

The embodiment shown in FIG. 2 differs from that shown in FIG. 1a in that each of the DBRs is a fixed DBR and in that each output waveguide from the Demux (i.e. each lasing channel) comprises an absorption modulator 203. For each lasing channel, the fixed reflectance wavelength of the DBR in that channel matches the wavelength of the respective output of the Demux.

The absorption modulator 203 in each output waveguide acts as a preventative mechanism for that lasing channel in the form of an optical shutter. That is to say, each absorption modulator 203 acts to prevent its associated DBR from reflecting light by blocking the light before it gets to the DBR.

Each absorption modulator 203 has an "on" state and an "off" state. In the "on" state the absorption modulator 203 prevents light from the Demux output to which it is optically coupled from reaching the respective DBR.

In the "off" state the DBR receives light from the respective output of the Demux, the light corresponding to the reflectance wavelength of that DBR. An active lasing channel is therefore provided.

All but one of the absorption modulators 203 will be "on" at a given time in order for an active lasing channel to be selected. When a DBR 206 of a desired lasing channel is chosen (i.e. when it is the only DBR for which the corresponding absorption modulator 203 exists in an "off" configuration where no bias is applied to it), it forms the front end mirror of the optical cavity.

Again, in some embodiments, two or more lasing channels may be selected at once. In such a scenario, all but the two or more corresponding absorption modulators 206 will be "on".

Two further embodiments of discrete wavelength tunable lasers 300a and 300b are described below with reference to FIGS. 3a, 3b and 3c.

Each discrete wavelength tunable laser 300a, 300b comprises an RSOA 301 with a highly reflective back facet 302.

Figure 3A:
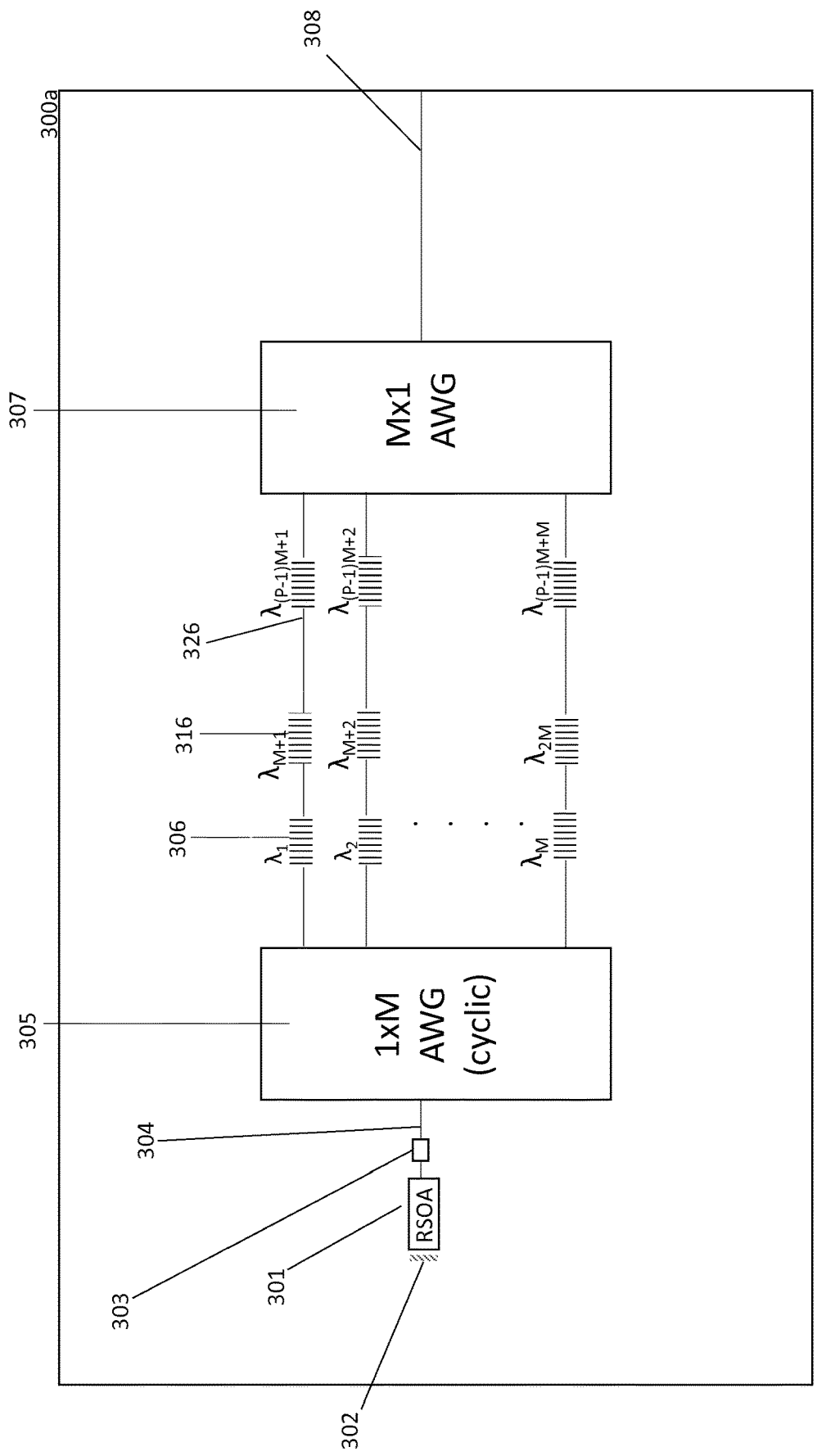
FIG. 3a shows a schematic diagram of an alternative tunable laser.

In the embodiment 300a shown in FIG. 3a, the RSOA is optically coupled to a 1×M AWG 305 and the M output waveguides of this AWG include DS-DBR gratings located therewith. In FIG. 3a, the AWG 305 is a cyclic AWG with at least P cycles, has a channel spacing of $\Delta f$, where $\Delta f$ is the tunable laser grid channel spacing, and an FSR of $M*\Delta f$. The DS-DBR gratings on each of the waveguides 1 to M are fabricated to have P reflecting wavelength states, the first waveguide having wavelength values 1, M+1, 2M+1, etc up to (P−1)M+1, the second waveguide having values 2, M+2, 2M+2, etc. up to (P−1)M+2, and the last waveguide having values M to PM (since (P−1)M+M=MP) where P is N/M, and N is the number of total wavelength states of the tunable laser.

For example, if P=7, there would be 7 grating wavelengths available per waveguide, and 7 sections to each DS-DBR grating. In other words, there would be 7 grating wavelengths available to be selected on for each spectral passband of the AWG. If M is 7, then there are 49 total modes corresponding to 49 wavelength channels available for the tunable laser. When a wavelength is selected on a DS-DBR, the DS-DBR becomes reflective at that wavelength so that the optical cavity of the laser is formed between the reflector 302 of the RSOA and the selected DS-DBR.

Figure 3B:
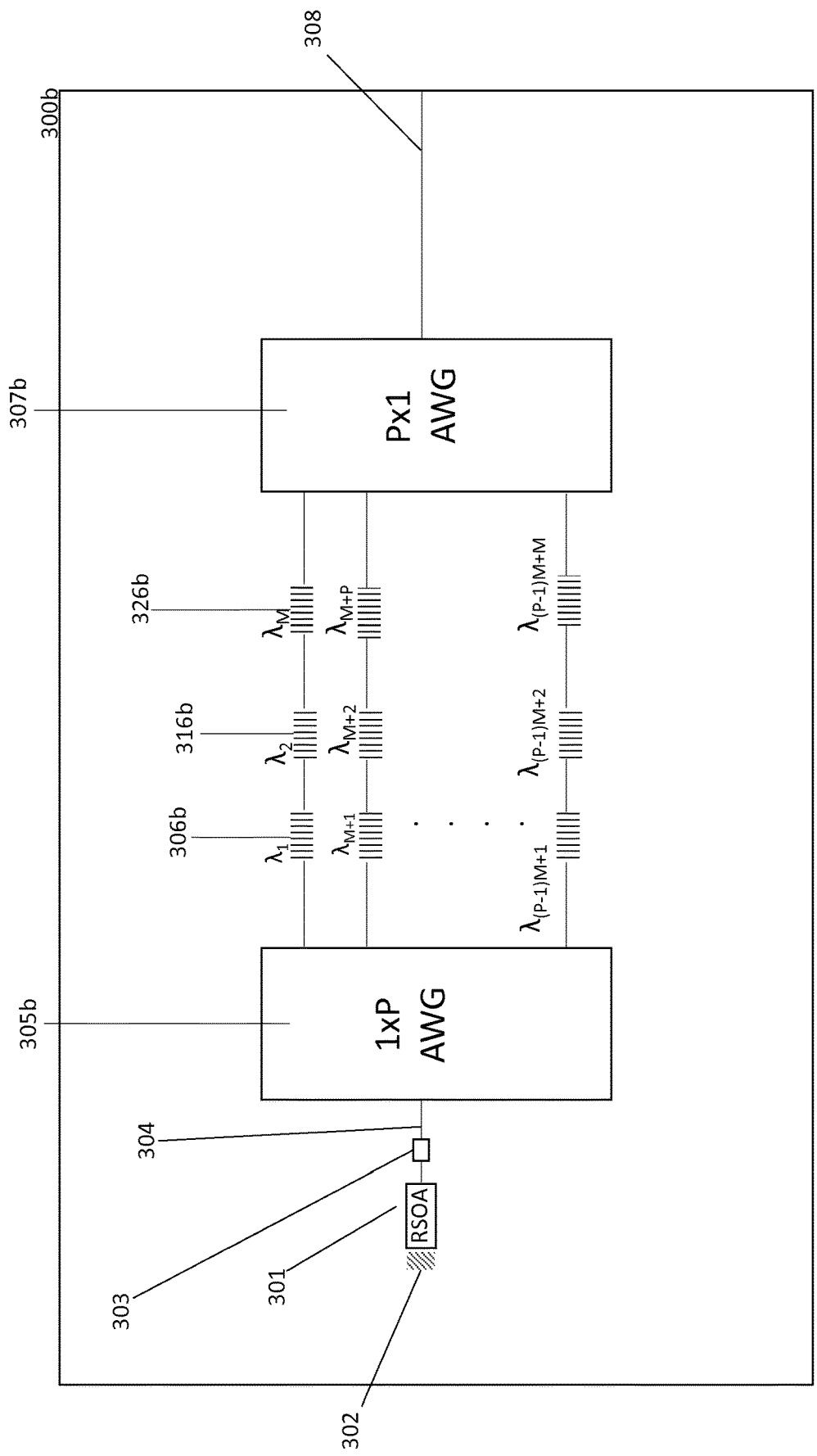
FIG. 3b shows a schematic diagram of a further alternative tunable laser.

The embodiment shown in FIG. 3b differs from that of 3a in that the 1×M AWG 305 of FIG. 3a is replaced by a non-cyclic 1×P AWG 305b.

A non-cyclic AWG can be advantageous in that the losses for the "worst case channel" of the AWG can be made to be lower. The transmission losses through the channels at the edges of an AWG's FSR are typically higher, and in a cyclic AWG the channels at the edges of the FSR must be used. With a non-cyclic AWG, the FSR can be designed to be significantly larger than the bandwidth of the channels that are used, so that the channels that are used are in the center of the FSR and therefore have a lower loss.

On the other hand, the use of cyclic AWGs can be advantageous over non-cyclic AWGs because when using a non-cyclic AWG for this purpose the individual channel transmission bands must each have pass band width of $M*\Delta f$, and the P passbands must pass all P*M channels, therefore the passbands must have transmission spectra that are close to square-shaped (thereby leading to a constant loss across all wavelengths being passed, and high isolation of all other wavelengths). For example, AWG channel 1 must pass all sub-channels 1 to M with little loss variation, and reject all other sub-channels, and AWG channel 2 must pass all sub-channels M+1 to 2M with little loss variation, and reject all other sub-channels. However such difficulties can be mitigated if the wavelength grid used by the system is allowed to have gaps between each group of M wavelength combs.

In the embodiment of FIG. 3b, the AWG 305b is a P-channel AWG with a channel spacing of $M\Delta f$, and a 3-dB channel transmission spectrum bandwidth sufficient to pass M channels of $\Delta f$ channel spacing. The DS-DBR gratings on waveguides 1 to P are fabricated to have M reflecting wavelength states, the first waveguide having wavelength values 1, 2, . . . M, the second having values M+1, M+2, . . . M+P, the third waveguide having wavelength values 2M+1, 2M+2, . . . 2M+P, and the last waveguide having wavelength values (P−1)M+1, (P−1)M+2, . . . (P−1) M+M, which is equal to PM.

Figure 3C:
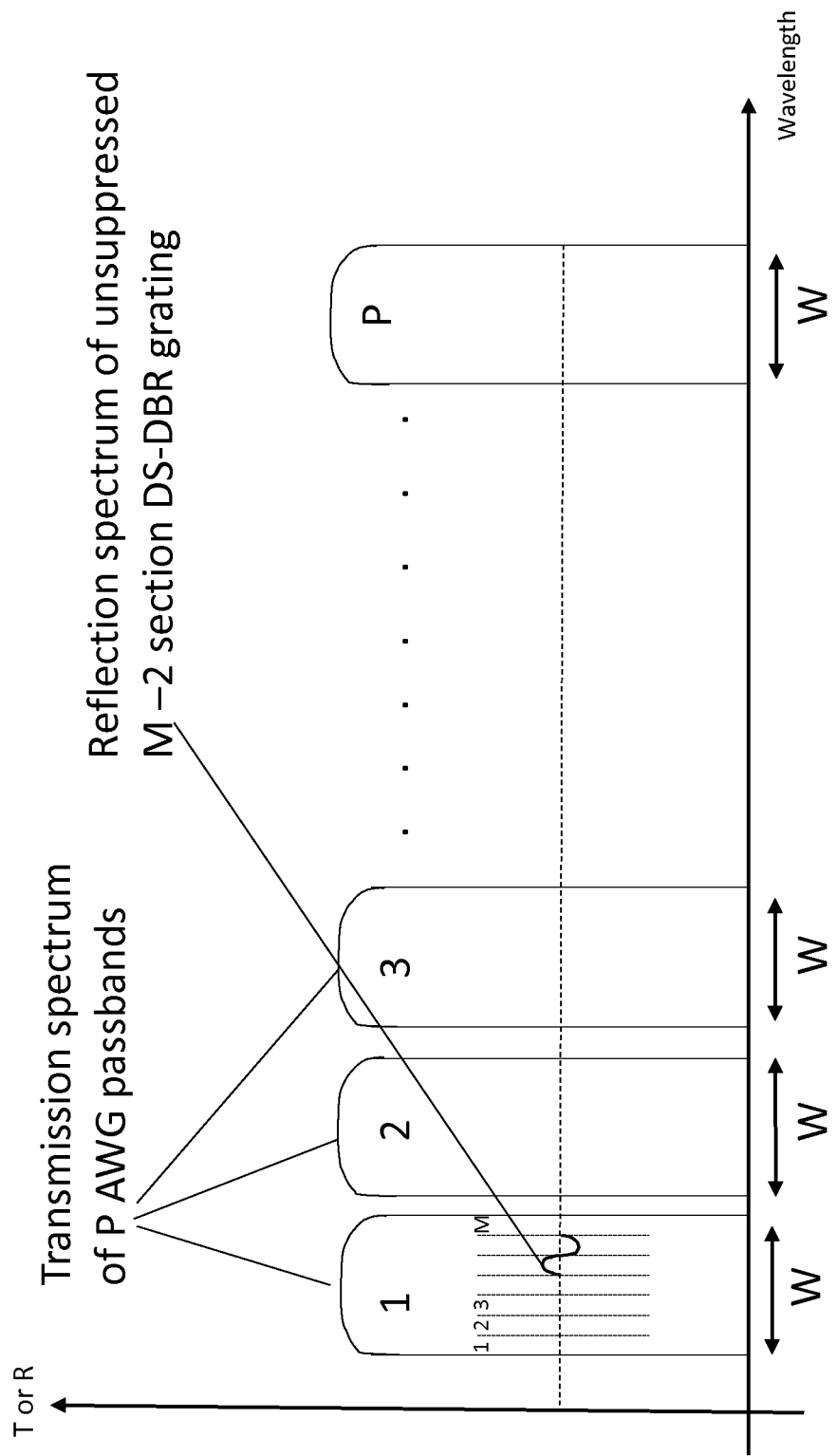
FIG. 3c shows a schematic diagram of spectral profiles of the AWG and DBR gratings of the embodiment shown in FIG. 3b.

FIG. 3c shows example transmission spectra of the P AWG channels of the AWG outputs shown in FIG. 3b, each output channel of the AWG having a spectral range "W" which lies within the bandwidth of the SOA. FIG. 3c also shows example reflection spectra of the M-section DS-DBR gratings on each of the P waveguides.

The selection of the wavelength channel M−2 is shown. This occurs when all sections other than section M−2 of a DS-DBR are suppressed on the first waveguide by a bias voltage applied to each electrode M−2 on the DS-DBR grating on the waveguide of AWG channel 1. In this way, the laser mode M−2 is selected out of M×P discrete modes available for this discrete-mode tunable laser. In an alternative example (not shown) the DBR could be tuned off the desired wavelengths and the application of a bias to a given section would select the mode of that section, rather than suppressing it.

An alternative discrete wavelength tunable laser 400 is described below with reference to FIG. 4. The embodiment shown in FIG. 4 differs from that shown in FIG. 1a in that the AWG is actually made up of two separate AWG stages; a first coarse AWG stage 405 and a second fine tuning AWG stage 409. The overall transmission function of the combination of AWGs 405 and 409 is the same or similar to the transmission function of AWG 105 in FIG. 1.

The coarse tuning AWG 405 takes the form of a 1×P AWG, having one input which is optically coupled to the RSOA on its input side and optically connected to a plurality P of output waveguides on its output side. The 1×P AWG itself passes a range of spectral passbands across each of its P respective outputs.

The fine tuning AWGs 409 each take the form of a 1×M AWG. The input of each of the 1×M AWG is optically coupled to one of the P respective outputs of the 1×P AWG and the M outputs are each optically coupled to an output waveguide. Each of the M output waveguides includes a tunable DBR grating.

Unlike the embodiments of FIGS. 3a and 3b, each selectable wavelength channel of the AWG has its own single-section grating. The single-section DBRs are much simpler to manufacture than the DS-DBR gratings of FIGS. 3a and 3b. The size of the 1×M and 1×P AWGs combined can be made to be smaller than a single 1×N grating. Therefore the size of the device of this embodiment can be less than that in FIG. 1, but will still be larger than those in FIGS. 3a and 3b.

Figure 4:
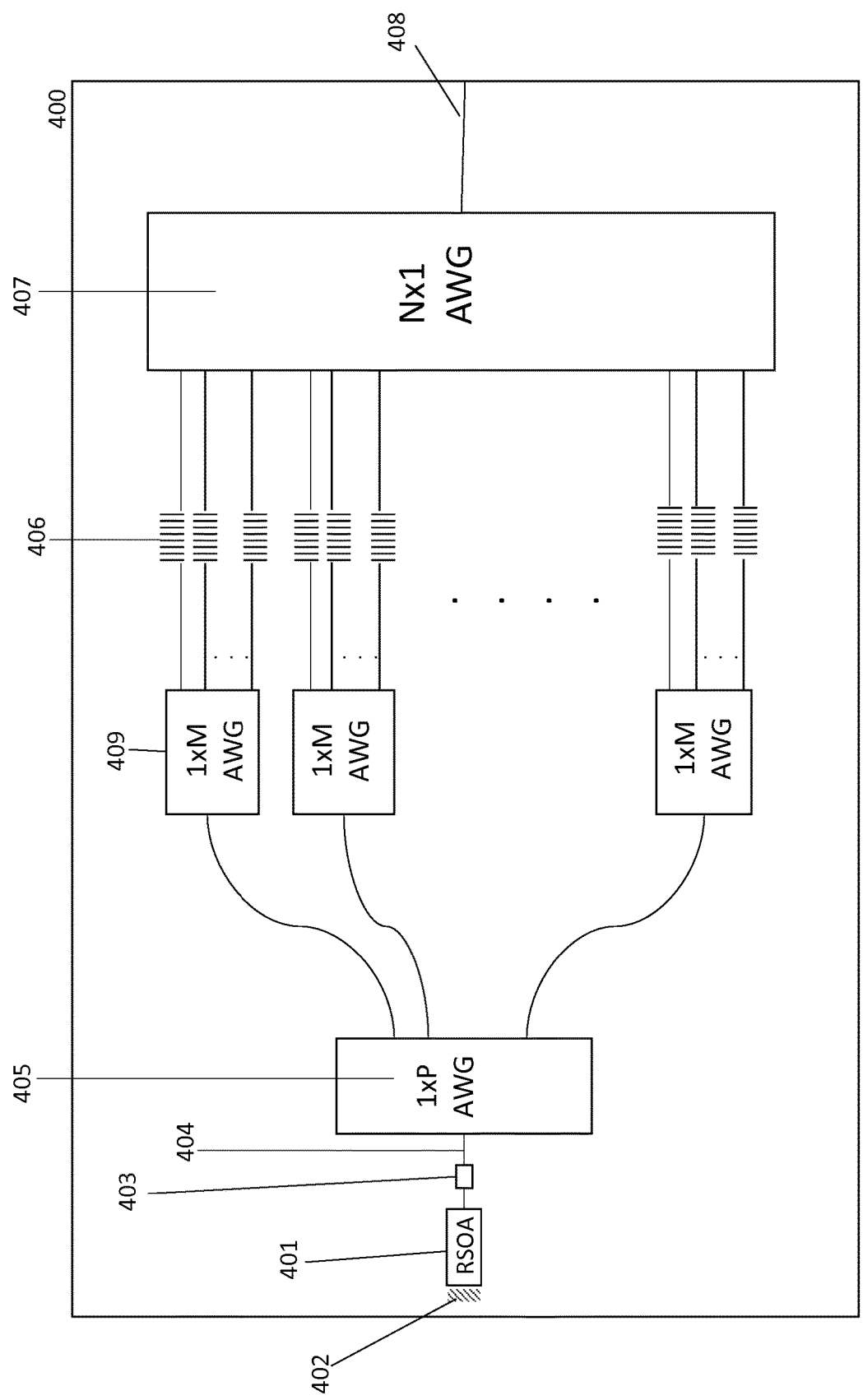
FIG. 4 shows a schematic diagram of a further alternative tunable laser.

In an alternative embodiment of FIG. 4, the location of the coarse and fine AWGs may be swapped so that AWG 405 is a cyclic AWG and gives a fine wavelength selection, in the same way as the 1×M cyclic AWG in FIG. 3a, and AWGs 409 give coarse wavelength selection.

The discrete wavelength tunable laser 400 includes a further N×1 AWG 407 which acts as a multiplexer to multiplex the signals from the M×P respective output waveguides to produce a common output of the laser.

Again, when the DBRs may take the form of the lasing suppression mechanisms. In which case, a bias would be applied to each DBR having a grating period corresponding to an undesired possible lasing mode.

Figure 5:
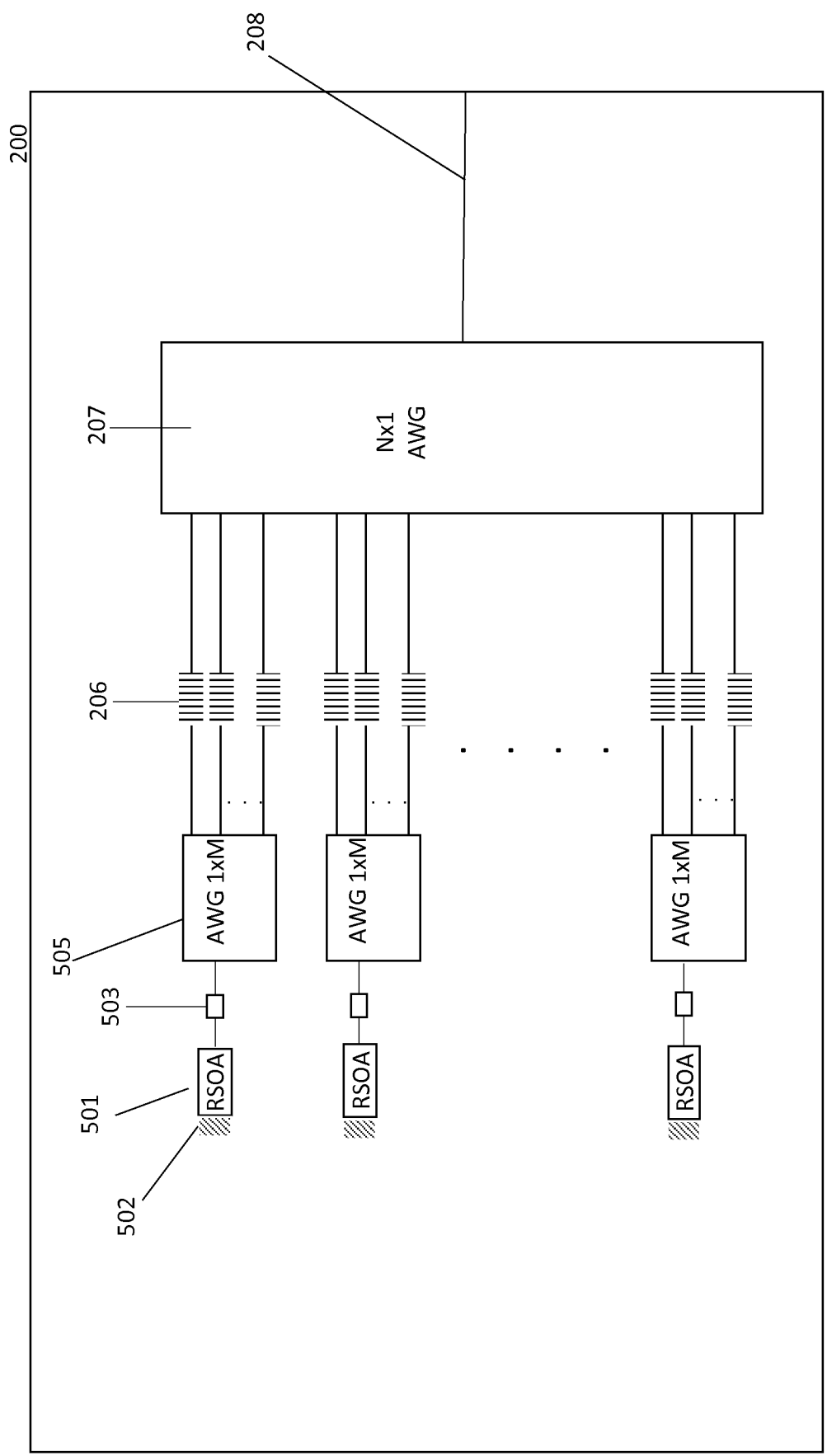
FIG. 5 shows a schematic diagram of a further alternative tunable laser.

FIG. 5 shows a schematic diagram of an example of a laser containing multiple RSOAs coupled to multiple respective AWGs.

For the same discrete wavelength states for the tunable laser as previous embodiments, the lasing cavities are divided amongst a plurality P of RSOAs, each RSOA having the same gain bandwidth in the case where the RSOAs are an array of RSOA waveguides on a single chip coming from the same wafer, or, alternatively, having different gain bandwidths optimized for its corresponding downstream AWG, in the case where the ROSA are different chips. In the embodiment shown, an RSOA 201 generates optical power for M lasing wavelengths using a downstream 1×M AWG. Each 1×M AWG is designed to pass a comb with a channel spacing of M*Δf, the first AWG passing wavelength values 1, 2, . . . M, the second passing values M+1, M+2, . . . 2M, the third passing wavelength values 2M+1, 2M+2, . . . 3M, etc., and the last waveguide having wavelength values (P−1)M+1, (P−1)M+2, . . . PM. The 1×M AWGs are thus designed the same as the AWGs 409 in FIG. 4.

As in the previous embodiments, the M outputs from the lasers from all of the AWGs 205 are combined using an N×1 multiplexer 207, which acts to multiplex the signals from the M×P respective output waveguides to produce a common output of the laser.

Compared with the embodiment in FIG. 4, the first 1×P AWG is replaced with RSOAs, thus the optical path length of the laser cavities is shorter and so tuning speed is faster and laser mode spacing larger, but this is achieved at the cost of a plurality of RSOAs. Additionally, if the laser is to be power efficient, only the RSOA that provides gain for the laser mode being selected should be powered on during the time that mode is selected, and all other RSOAs should be powered off. This adds additional complexity to the tuning electronics. For a 49-wavelength output laser, P could be 7 and the number of RSOAs would be 7. In this embodiment the whole device could be integrated on one chip or it could be constructed from several chips.

Although the present invention is primarily concerned with selection of a desired lasing channel via suppression of undesired lasing channels, it should be understood that the skilled person could, as in the above aspect, adapt any one of the embodiments described herein so that any of the lasing suppression mechanisms could be adapted to form a lasing enhancement mechanism. As used herein, the term "lasing control mechanism" means a mechanism configured to suppress lasing, or a mechanism configured to enhance lasing, or a mechanism that is both (i) capable of suppressing lasing and (ii) capable of enhancing lasing.

Figure 6:
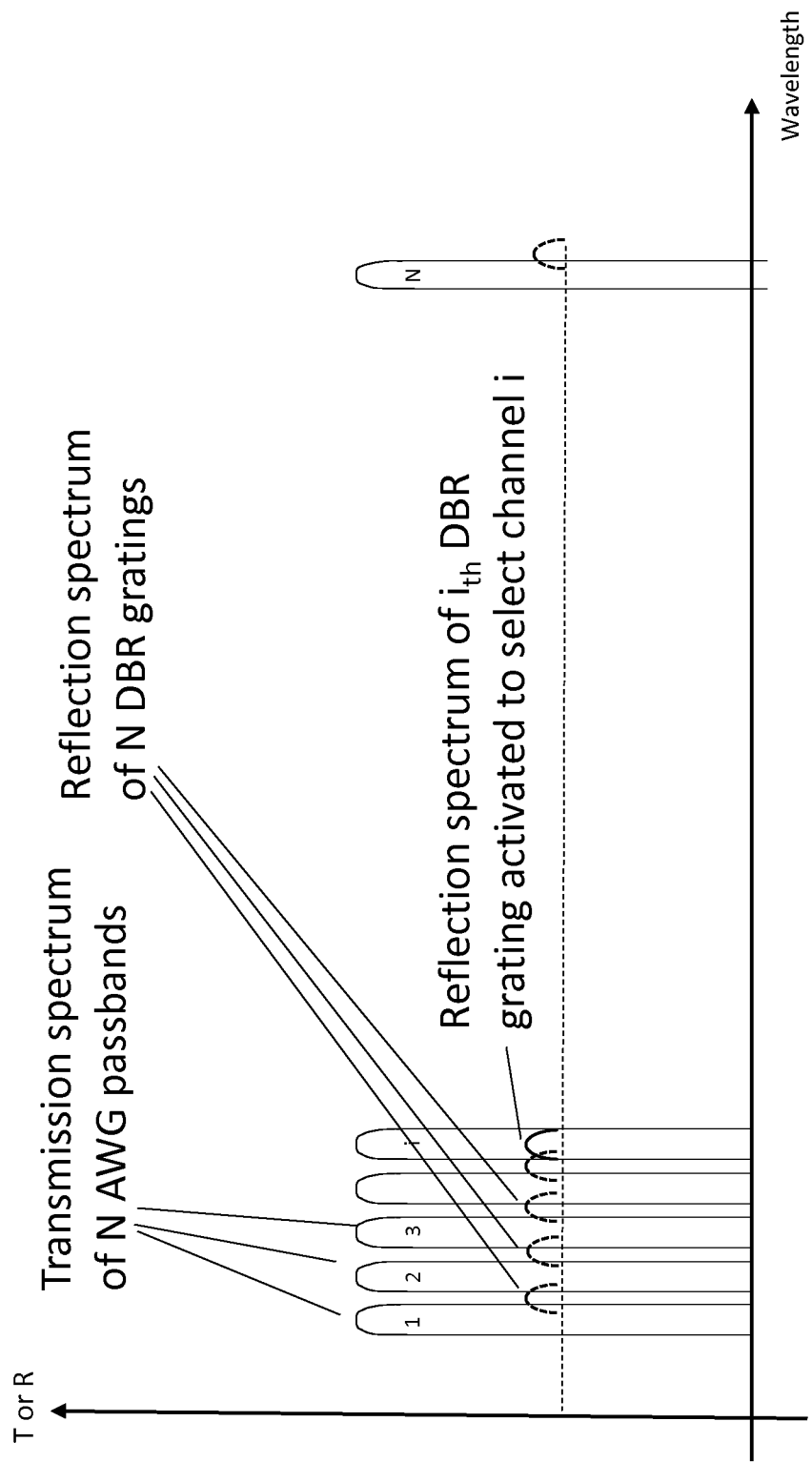
FIG. 6 shows a schematic diagram of spectral profiles of the AWG and DBR gratings of an alternative version of the laser shown in FIG. 3b.

For example, where the lasing suppression mechanism in a given lasing channel is a tunable DBR, the DBR may be tuned to the wavelength of the lasing channel and may detune from the lasing wavelength upon application of a bias. FIGS. 1b and 3c depict examples in which a lasing mode is selected by application of bias to one or more lasing suppression mechanisms to "de-select" all modes other than that of the desired lasing channel. However, it should be understood that the skilled person would realise that the DBR could instead exist in a resting state which is de-tuned from the lasing wavelength of the channel at rest and may, upon application of a bias, become tuned to reflect a wavelength corresponding to the lasing channel. In that case, the DBR would act as a lasing enhancer rather than a lasing suppressor. It should also be envisaged that a combination of suppression and enhancement could be applied to select the desired DBR. FIG. 6 depicts an example of lasing channel selection which differs from that of FIG. 3c in that the DBRs act as lasing enhancers upon application of a bias rather than as lasing suppressors.

When a DBR is configured to act as a lasing suppression mechanism upon application of a bias this is achieved by selecting a grating period of the DBR which reflects light having a wavelength corresponding to that of the passband of the respective Demux output. The DBR will include an optoelectronic region such as a pin junction or pn junction across which a bias can be applied. Upon application of the bias, the resulting phase change means that the reflectance peak of the DBR grating will shift so that it no longer corresponds to that of the lasing channel. When a DBR is configured to act as a lasing enhancement mechanism, the opposite is true so the reflectance spectrum of the DBR will only overlap with the wavelength of light in that lasing channel when a bias is applied to the optoelectronic region of the DBR. While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For example, in some embodiments described herein, the AWG is used to give a wavelength filter function. Echelle gratings could also be used in place of any of the AWGs.

The AWG of this embodiment and the AWGs of embodiments described below may be fabricated integrally with the other features (waveguides) or may be fabricated as a separate chip and aligned during assembly with the waveguides on the silicon chip.

The AWG 105 may be an integrated part of the optical chip (100) or may be a separate device. The optical chip 100 may optionally be fabricated in silicon such as silicon-on-insulator.

Whilst the embodiments described herein all comprise a reflective semiconductor optical amplifier (RSOA), it is envisaged that they could all be carried out using a standard SOA (without a mirrored surface). In this case, the SOA would be a double sided structure and both sides would need to be coupled to the SOI host chip. A separate rear mirror (not part of the SOA) would need to be fabricated to be optically coupled to the back side of the SOA.

It is envisaged that any of the embodiments described herein could be adapted to replace the RSOA with a standard SOA, for example such that the laser cavity included an exit mirror to the left of the SOA in FIG. 1a. In such an embodiment, no Mux would be required; however, it would be necessary to add an absorber or similar device with high return loss at the end of each of the spatial paths. All references referred to above are hereby incorporated by reference.

The invention claimed is:

1. A discrete wavelength tunable laser, comprising:
 a reflective semiconductor optical amplifier (RSOA) comprising a back end mirror;
 a wavelength demultiplexer (Demux), having a Demux input configured to receive an output from the RSOA, and a plurality of Demux outputs, each Demux output defining a different spatial path for a respective lasing channel, the Demux being configured to direct light of one wavelength from the Demux input to one of the Demux outputs and to direct light of another wavelength from the Demux input to another one of the Demux outputs; each of the respective lasing channels being within the bandwidth of the RSOA;
 a reflector located within each spatial path for reflecting light of the respective lasing channel; and
 a plurality of lasing control mechanisms, each located within a respective lasing channel,
 wherein a first lasing control mechanism of the plurality of lasing control mechanisms is configured:
  in a first state, to enable lasing in a first lasing channel of the respective lasing channels; and
  in a second state, to suppress lasing in the first lasing channel,
 wherein the reflector of the first lasing channel is configured, in the first state of the first lasing control mechanism, to have a reflection peak at or near to a center wavelength of the first lasing channel,
 wherein the back end mirror of the RSOA and the reflector of the first lasing channel are configured, in the first state of the first lasing control mechanism, to form the optical cavity of the tunable laser,
 wherein the first lasing control mechanism is an optical amplitude modulator, and
 wherein the Demux is between the RSOA and the reflectors.

2. The discrete wavelength tunable laser according to claim 1, wherein a single desired lasing channel is configured to be selected by application of the lasing control mechanism in each spatial path other than the spatial path corresponding to the desired lasing channel to suppress lasing in each spatial path other than the spatial path corresponding to the desired lasing channel.

3. The discrete wavelength tunable laser of claim 1, wherein the optical amplitude modulator is a variable optical attenuator (VOA).

4. The discrete wavelength tunable laser of claim 3, wherein the VOA comprises a carrier injection region, the optical attenuation within which is controllable.

5. The discrete wavelength tunable laser of claim 4, wherein the carrier injection region comprises a pn junction.

6. The discrete wavelength tunable laser of claim 4, wherein the carrier injection region comprises a pin junction.

7. The discrete wavelength tunable laser of claim 1, wherein the first lasing control mechanism is separate from the reflector for reflecting the respective lasing channel.

8. The discrete wavelength tunable laser of claim 1, wherein:
 the reflector of the first lasing channel is configured, in the second state, to tune the reflection peak of the reflector of the first lasing channel away from the center wavelength of the respective spatial path.

9. The discrete wavelength tunable laser of claim 1, wherein each reflector is a distributed Bragg reflector (DBR).

10. The discrete wavelength tunable laser of claim 9, wherein:
 the first lasing control mechanism is separate from the reflector for reflecting the respective lasing channel, and
 each DBR is a fixed wavelength DBR.

11. The discrete wavelength tunable laser of claim 9, wherein:
 the reflector of the first lasing channel is configured, in the second state, to tune the reflection peak of the reflector of the first lasing channel away from the center wavelength of the respective spatial path, and each DBR is a tunable DBR with a wavelength tunable reflection spectrum.

12. The discrete wavelength tunable laser of claim 11, wherein the tunable DBR comprises a pn or a pin junction.

13. The discrete wavelength tunable laser of claim 1, wherein the Demux is a passive optical component.

14. The discrete wavelength tunable laser of claim 13, wherein the Demux comprises any one of:
an Arrayed Waveguide Grating (AWG),
a Planar Concave Grating (PCG),
a ring resonator array,
an interleaver structure, or
an angled multimode interference (MMI) device.

15. The discrete wavelength tunable laser of claim 1, comprising a multiplexer (Mux) to multiplex light from each of the lasing channels into a single output.

16. The discrete wavelength tunable laser of claim 15, wherein the Mux comprises any one of:
an Arrayed Waveguide Grating (AWG),
a Planar Concave Grating (PCG),
a ring resonator array,
an interleaver structure, or
an angled multimode interference device (MMI).

17. The discrete wavelength tunable laser of claim 1, wherein the Demux is a flat-top Demux.

18. A discrete wavelength tunable laser, comprising:
a reflective semiconductor optical amplifier (RSOA) comprising a back end mirror;
a wavelength demultiplexer (Demux), having a Demux input configured to receive an output from the RSOA, and a plurality of Demux outputs, each Demux output defining a different spatial path for a respective lasing channel, the Demux being configured to direct light of one wavelength from the Demux input to one of the Demux outputs and to direct light of another wavelength from the Demux input to another one of the Demux outputs; each of the respective lasing channels being within the bandwidth of the RSOA;
a reflector located within each spatial path for reflecting light of the respective lasing channel; and
a lasing control mechanism located within each lasing channel, each lasing control mechanism configured to suppress or enhance the lasing of said lasing channel,
wherein a reflector of a first lasing channel of the respective lasing channels is configured, in a first state in which a first lasing control mechanism of the first lasing channel enables lasing of the first lasing channel, to have a reflection peak at or near to a center wavelength of the first lasing channel,
wherein the back end mirror of the RSOA and the reflector of the first lasing channel are configured, in the first state of the first lasing control mechanism, to form the optical cavity of the tunable laser,
wherein the first lasing control mechanism is an optical amplitude modulator, and
wherein the Demux is between the RSOA and the reflectors.

19. The discrete wavelength tunable laser of claim 18, wherein each lasing control mechanism is configured to receive a bias voltage or a bias current to suppress or enhance the lasing of said lasing channel upon application of the bias voltage or the bias current.

20. A discrete wavelength tunable laser comprising:
a reflective semiconductor optical amplifier (RSOA) comprising a back end mirror;
a wavelength demultiplexer (Demux), having a Demux input configured to receive an output from the RSOA, and a plurality of Demux outputs, each Demux output defining a different spatial path for a respective lasing channel, the Demux being configured to direct light of one wavelength from the Demux input to one of the Demux outputs and to direct light of another wavelength from the Demux input to another one of the Demux outputs; each of the respective lasing channels being within the bandwidth of the RSOA;
a reflector located within each spatial path for reflecting light of the respective lasing channel; and
a plurality of lasing control mechanisms, each located within a respective lasing channel,
wherein a first lasing control mechanism of the plurality of lasing control mechanisms is configured:
in a first state, to enable lasing in a first lasing channel of the respective lasing channels; and
in a second state, to suppress lasing in the first lasing channel,
wherein the reflector of the first lasing channel is a distributed Bragg reflector (DBR) separate from the first lasing control mechanism and is configured, in the first state of the first lasing control mechanism, to have a reflection peak at or near to a center wavelength of the first lasing channel,
wherein the back end mirror of the RSOA and the DBR of the first lasing channel are configured, in the first state of the first lasing control mechanism, to form the optical cavity of the tunable laser, and
wherein the Demux is between the RSOA and the reflectors.

* * * * *